United States Patent [19]

Burns et al.

[11] 3,941,297

[45] Mar. 2, 1976

[54] METHOD AND APPARATUS FOR SIMULTANEOUSLY BONDING A PLURALITY OF LEAD FRAMES TO A PLURALITY OF PLANAR ARTICLES

[75] Inventors: John Andrew Burns, New Hope Borough, Pa.; Andrew Robert Sivo, Jr., Hamilton Township, Mercer County, N.J.

[73] Assignee: Western Electric Company, Inc., New York, N.Y.

[22] Filed: June 2, 1975

[21] Appl. No.: 583,213

[52] U.S. Cl. .............. 228/180 A; 228/179; 228/4.1; 228/405
[51] Int. Cl.² .................. B23K 19/00; B23K 37/04
[58] Field of Search ......... 228/4.1, 4.5, 5.5, 6, 44.1, 228/49, 106, 179, 180, 193, 228, 242, 228/212, 213

[56] References Cited
UNITED STATES PATENTS 3,868,764  3/1975  Hartleroad et al. ............. 228/180 X
3,896,541  7/1975  Golinski ......................... 228/213 X

*Primary Examiner*—Al Lawrence Smith
*Assistant Examiner*—Margaret Joyce
*Attorney, Agent, or Firm*—D. P. Kelley; E. W. Pfeifle

[57] ABSTRACT

Method and apparatus are disclosed for concurrently thermocompression bonding a plurality of lead frames to a plurality of planar articles. In operation, a plurality of lead frames are referenced to a plurality of unheated bonding tips and to the associated metallized bonding sites on a first side of a plurality of planar articles. The bonding tips are then simultaneously activated to independently move the referenced lead frames and articles in a first direction to engage the second side of each article with a heated thermode, and apply a sufficient compressive force to bond the leads of each lead frame to the associated bonding sites on the referenced article. The bonding tips are then returned to their initial or starting position.

14 Claims, 5 Drawing Figures

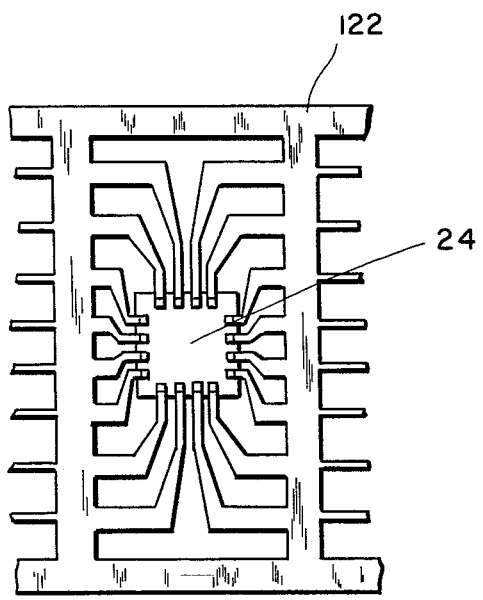
F I G 5

METHOD AND APPARATUS FOR SIMULTANEOUSLY BONDING A PLURALITY OF LEAD FRAMES TO A PLURALITY OF PLANAR ARTICLES

BACKGROUND OF THE INVENTION

1. Field of the Invention

This invention relates to method and apparatus for simultaneously bonding a plurality of lead frames to a plurality of planar articles, and more particularly, to method and apparatus for simultaneously mass thermocompression bonding a plurality of lead frames to a plurality of planar articles.

2. Description of the Prior Art

The beam-leaded semiconductor device is a recent development which comprises a semiconductor element including a chip or die of semiconductor material within which is fabricated, by known planar processing techniques, either an individual semiconductor component, such as a transistor, or a plurality of components suitably interconnected to provide a monolithic integrated circuit network. Formed on one of the major surfaces of the die, during fabrication of the element, are a plurality of beam leads, primarily of gold, which are electrically connected to appropriate regions on the semiconductor die and extend outward beyond the edges of the die in an array parallel to the major surface of the die. The beam leads can be formed in any known manner, such as, for example, by plating techniques or by a film strip process as disclosed, for example, in U.S. Pat. No. 3,777,365, issued to C. W. Umbaugh on Dec. 11, 1973.

The beam leads provide a means for making contact between the die and the metallized portions of a miniceramic substrate, a substrate of a circuit board, or a device enclosure on which the semiconductor element is mounted. The semiconductor device is placed on the surface of the substrate with the beam leads in alignment with the metallized areas of the substrate. The beam leads are then bonded directly to the metallized areas as by thermal compression bonding, ultrasonic bonding, or welding. Thus, the tedious, error-prone, time-consuming prior art process of manually bonding lead wires between semiconductor dies and metallized areas of substrates is eliminated. See, for example, U.S. Pat. No. 3,627,190, issued to H. J. Ramsey on Dec. 14, 1971 which discloses apparatus for the thermocompression bonding of a beam-leaded device to a substrate. It is also known to simultaneously thermocompression bond a plurality of beam-leaded devices to a similar plurality of metallized patterns on one side of a single ceramic substrate. In this regard see, for example, U.S. Pat. No. 3,699,640, issued to B. H. Cranston et al. on Oct. 24, 1972 which discloses method and apparatus for compliant bonding beam-leaded semiconductor devices to a substrate. Once the beam-leaded devices have been bonded to the array of metallized patterns on a substrate, the substrate can be machined to separate the plurality of bonded devices and metallized patterns into a similar plurality of miniceramic substrates having the metallized bonding sites adjacent the edges thereof. The bonding sites on each miniceramic substrate can then be bonded to a lead frame for subsequent interconnection to other circuits.

It is known to thermocompression bond the leads of individual lead frames to separate substrates in rapid succession for increased productivity. The most widely known method for effecting the thermocompression bond is to align both the lead frame and the bonding sites on the substrate with each other and with the elements of a bonding station, and then to apply a heated thermode onto the leads of the lead frame with sufficient compressive force and temperature to effect the bonds. It is also known to transfer the necessary heat through the substrate and to the bonding sites for the thermocompression bond, but under such conditions there has been a tendency towards increased cracking in the substrates unless extreme care and control are used in the bonding process. It is for this reason that the application of the heated thermode to the leads of the lead frame is preferred.

Attempts at applying known methods and apparatus to accomplish the simultaneous thermocompression bonding of a plurality of lead frames to a similar plurality of substrates has resulted in many problems which have tended to discourage further development of a production type mass bonder. The problems encountered related, inter alia, to the fact that the details on the heated thermode engaging the leads, which are referenced to the bonding sites on the substrates, must be accurately placed on the leads to effect a proper bond at each bonding site. The details on the thermode, and the thermode itself, however, expand as the thermode is heated to a particular bonding temperature. It, therefore, became necessary to precalculate the amount of thermal expansion that would take place for a particular thermode for a predetermined temperature and from such calculations accordingly machine the cold thermode. If the bonding temperature had to be sufficiently changed, either higher or lower, it might become necessary to machine a new thermode. An alternative arrangement would be to provide an array of separately heated bonding tips capable of being simultaneously activated. Such arrangement, however, produced, inter alia, other problems such as (a) the necessity to precalculate the dimensions of the pistons, sleeves, and other elements which activate and control the movement of each bonding tip in order to compensate for expansion from the heat conveyed to each of the elements in accordance with its relative position in the array; (b) the ability to individually control the plurality of heating units in a manner to achieve the same temperature at each bonding tip in the array; and (c) to provide a device which simultaneously activates the heated bonding tips and applies an equal predetermined pressure to all bonding tips while the device is being subjected to an elevated temperature from the heating elements associated with each bonding tip. All of the above problems, of course, become more insurmountable as the number of lead frames and substrates to be simultaneously bonded increases.

BRIEF SUMMARY OF THE INVENTION

The present invention relates to method and apparatus for concurrently bonding a plurality of substrates to a plurality of lead frames, and more particularly, to method and apparatus for concurrently mass thermocompression bonding a plurality of substantially planar articles to a plurality of lead frames.

The invention further relates to method and apparatus for concurrently bonding the leads of a plurality of lead frames to respective bonding sites on the first faces of a corresponding plurality of substantially planar articles where the plurality of lead frames are referenced to separate ones of a plurality of bonding tips, and the bonding sites on each of the plurality of articles are registered with an associated one of the lead frames. Each of the registered bonding tips, lead frames, and planar articles are then concurrently and independently moved in a direction to engage the second face of the plurality of articles with a heated thermode and then apply a substantially uniform bonding force concurrently to all of said leads and bonding sites to mass bond the lead frames to the associated articles.

Other and further aspects of the present invention will become apparent during the course of the following description and by reference to the accompanying drawings and the appended claims.

BRIEF DESCRIPTION OF THE DRAWINGS

Referring now to the drawings, in which like numerals represent like parts in the several views:

FIG. 5 is a plan view of a lead frame and a substrate as bonded together by the apparatus of FIG. 1.

DESCRIPTION OF THE PREFERRED EMBODIMENTS

The present invention has been described primarily in terms of a mass bonder having bonding areas arranged at the intersections of rows and columns of an array. However, it will be understood that such description is exemplary only and is for purposes of exposition and not for purposes of limitation. It will be readily appreciated that the inventive concept described is equally applicable to any mass bonding configuration, and that the elements described as associated with a row of the array could similarly be associated with a column of the array or any other arrangement within the mass bonder of the present invention.

Figure 1:
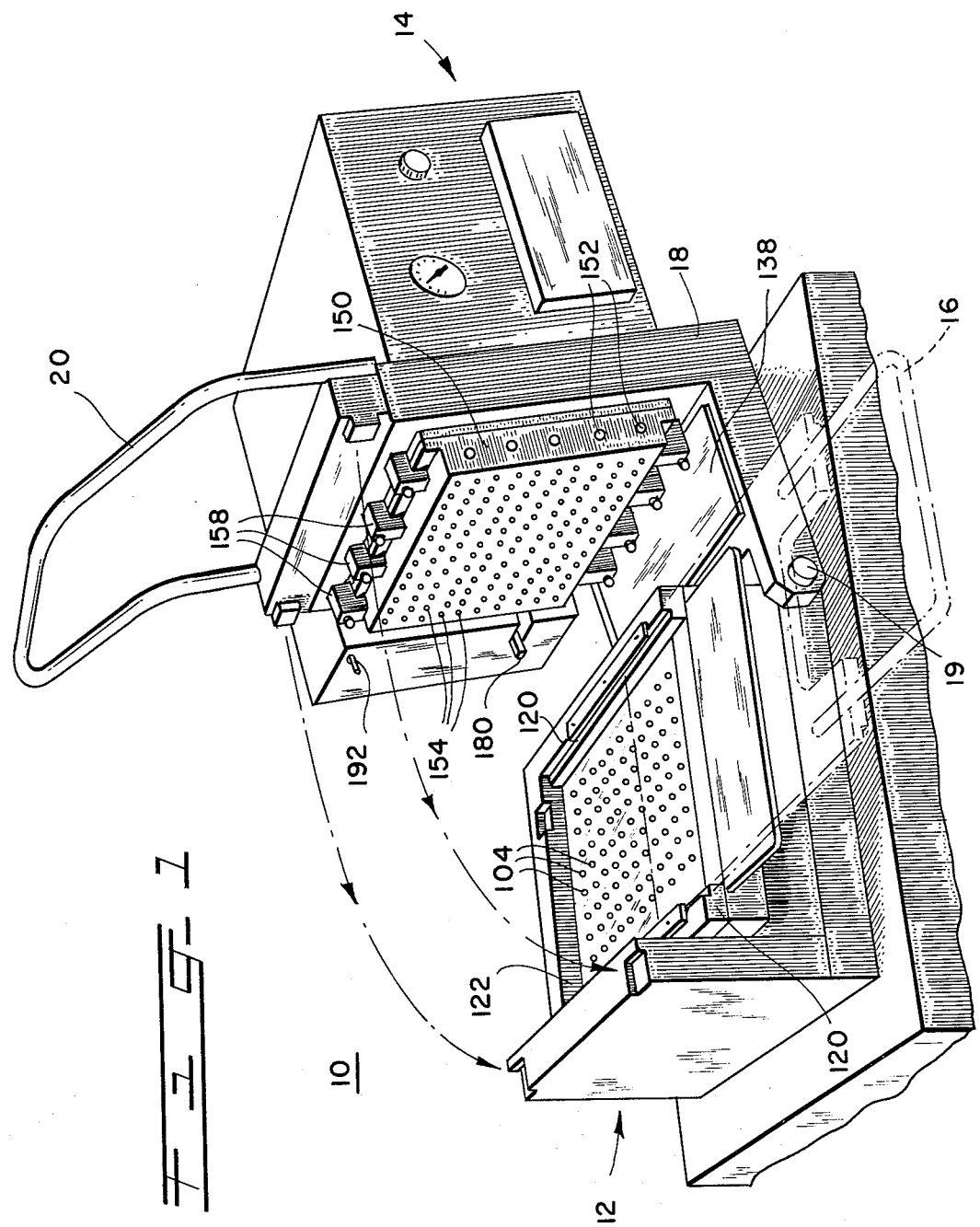
FIG. 1 is a perspective view of apparatus in accordance with the present invention for mass bonding a plurality of lead frames to a similar plurality of substrates.

In FIG. 1, a mass bonding apparatus, designated generally as 10, capable of concurrently thermocompression bonding a plurality of lead frames to bonding sites on a plurality of planar articles, such as, for example, substrates, is illustrated. Bonding apparatus 10 includes a lower section 12, an upper section 14 positioned directly above lower section 12 during the mass bonding operation, and a bonding insert assembly 16 (shown in phantom) which can be slidably mounted on lower section 12. To make maintenance routines for the lower and upper sections 12 and 14 easier, it is preferable that upper section 14 be removable from lower section 12, as shown, for example, in FIG. 1. There, upper section 14 is shown as hinged to lower section 12 by means of an L-shaped bracket 18 which is rotatably secured to lower section 12 by a pivotal pin 19. A handle 20 is provided to aid in the removal or restoration of upper section 14 to the bonding position. Other arrangements for the removal and restoration of upper section 14 will occur to those skilled in the art.

Figure 2:
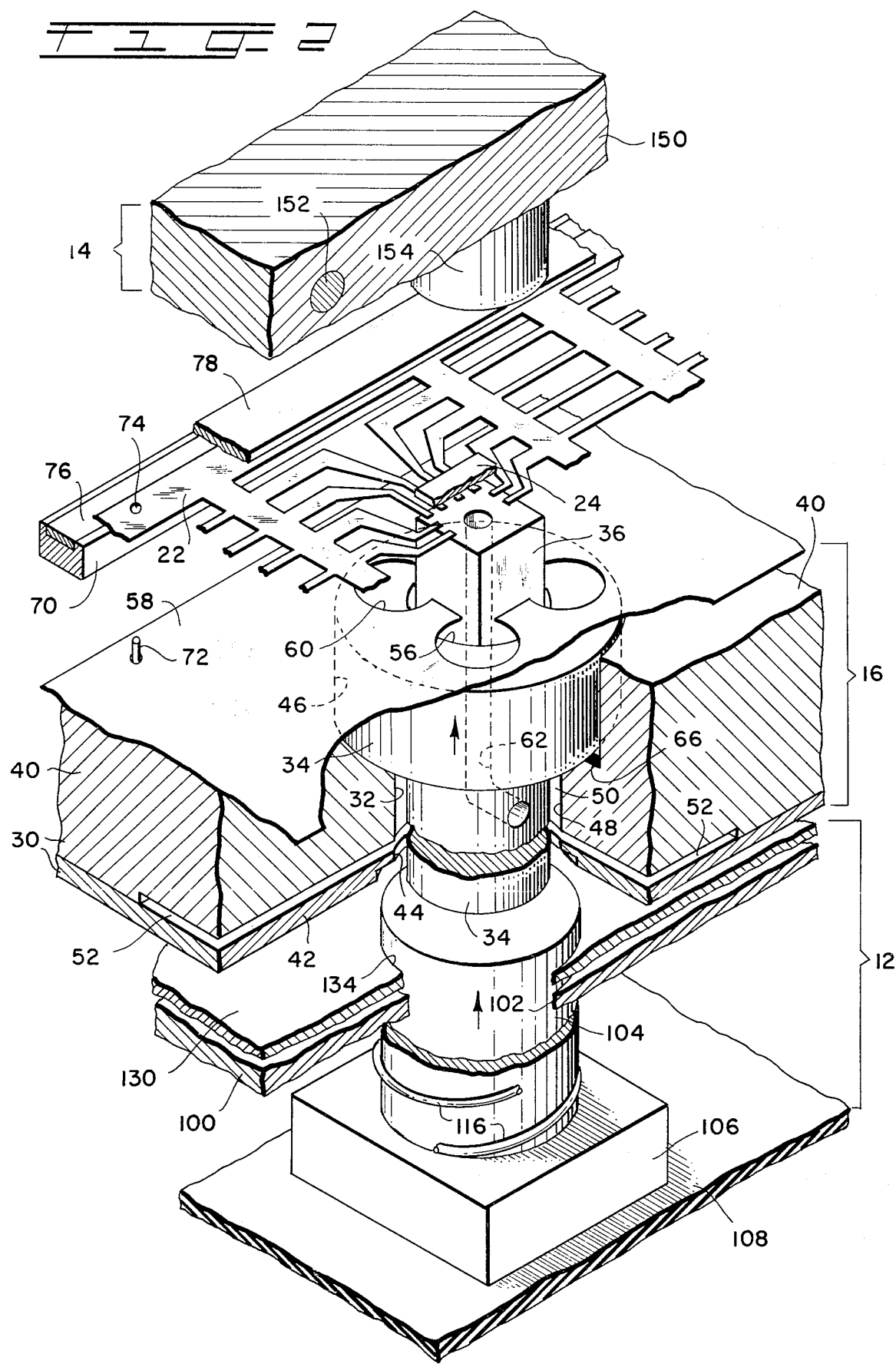
FIG. 2 is a perspective view illustrating certain details of the apparatus, specifically the structure of the apparatus for bonding one lead frame to one substrate.
Figure 3:
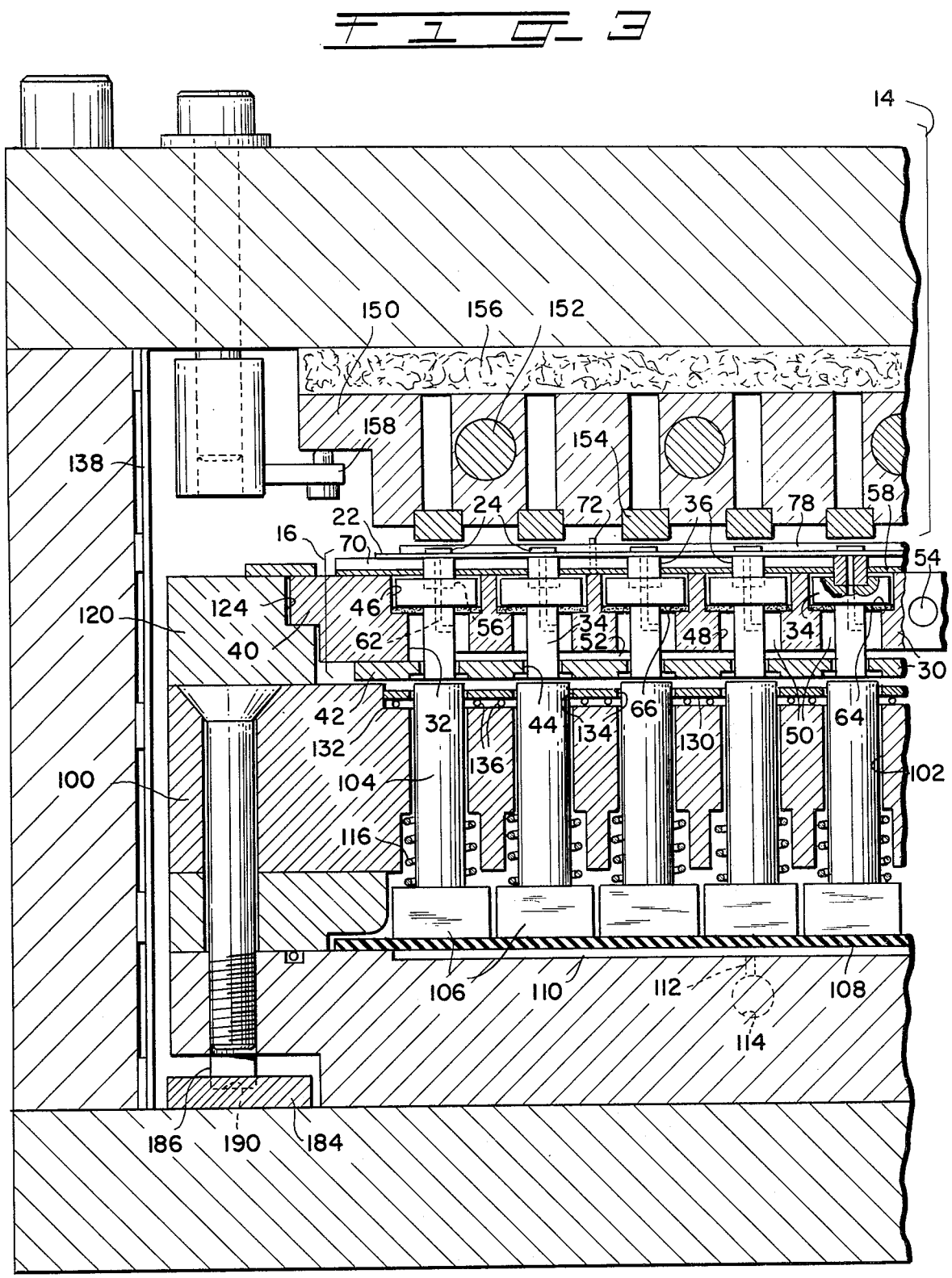
FIG. 3 is a plan view of the apparatus of FIG. 1 with portions broken away in order to show certain details.

The preferred embodiment of the present invention for the internal arrangement of lower section 12, upper section 14, and bonding insert assembly 16 can best be seen in FIGS. 2 and 3. There, bonding insert assembly 16 is shown as comprising a block 30 having a separate aperture 32 formed therein at each point of intersection between the rows and columns of a particular array corresponding to the bonding areas of mass bonder 10, a separate ram 34 mounted for independent axial movement in each of apertures 32, and a bonding tip 36 extending from the end of each ram 34 adjacent the associated lead frame 22 and substrate 24 to be bonded. Block 30 is illustrated as comprising a first plate 40 and a second plate 42 secured to the bottom face of first plate 40 such that the longitudinal axes of the array of apertures 32 in the first and second plates 40 and 42 are in alignment.

Apertures 32 in block 30 and the associated rams 34 can be of any configuration which permits the independent movement of each of rams 34 along the longitudinal axis thereof. In the preferred embodiment of the present invention, rams 34 are each shown as having a stepped cylindrical shape with a T-shaped longitudinal cross section. Apertures 32 in block 30 each have a two-stepped configuration, comprising a sidewall 44 in the upper step of first plate 40, and sidewall 46 in second plate 42, which limit movement of the associated piston along the longitudinal axis thereof. The sidewall 48 of each of apertures 32 in the lower step of first plate 40, together with lower plate 42 and the associated ram 34, forms a chamber 50 therebetween. The chambers 50 are interconnected by ducts 52 which ultimately communicate with a port 54. Port 54 is adapted for connection to an external source of vacuum (not shown).

Each bonding tip 36 is mounted in a recess 56 in the top surface of a separate ram 34 and extends thereabove. Bonding tips 36 are preferably formed of a material, such as, for example, zirconium oxide, which has good thermal insulation properties and sufficient strength to withstand, without damage, the temperature and pressure gradients encountered during the bonding operation. A separate strip of material 58 accurately retains the bonding tips 36 of each row of the array in their respective recesses 56 in rams 34. Each strip of material 58 has openings 60 formed therein which correspond to the exact position of each bonding tip 36 in the associated row in the array, each opening 60 having a configuration which engages at least a portion of the sides of the associated bonding tip 36. Each strip of material 58, therefore, functions to accurately position and guide each bonding tip 36 and to deflect, in the immediate area of the associated bonding tips 36, to follow the motion of each bonding tip 36 during the bonding operation. In the assembled position, an aperture 62 formed in each bonding tip 36 and the associated ram 34 forms a passage between the top surface of the bonding tip 36 and the chamber 50 associated therewith. In the initial or starting position of the operating cycle, each of the rams 34 rests on the top step 64 of the associated aperture 32 with the bottom of each ram 34 being essentially in line with the bottom surface of second plate 42 of block 30. Preferably a washer 66 is mounted on each top step 64 to avoid increased leakage from chamber 50 when rams 34 move upward during the bonding operation.

Bonding insert assembly 16 is adapted for removal from between lower section 12 and upper section 14 primarily for loading and unloading lead frames 22 and planar articles 24, hereinafter referred to as substrates 24, both before and after the bonding operation, and also for ease of maintenance. Advantageously, means are provided to properly register the plurality of lead frames 22 with their respective bonding tips 36. One means for properly mounting and registering lead frames 22 adjacent the associated bonding tips 36 is shown in FIGS. 2 and 3. There, spaced-apart metallic strips 70 are mounted on first plate 40 on either side and parallel with each row of bonding tips 36. A strip of lead frames 22, having a number of lead frames and a distance between adjacent ones thereof which corresponds to the bonding tips 36 of each row of the array, is placed on each pair of adjacent metallic strips 70. Aligning pins 72 extending through each of metallic strips 70 engage referencing apertures 74, formed in each edge of a lead frame strip, to reference the lead frames 22 to the associated bonding tips 36 in a row of mass bonder 10. A strip of magnetized material 76 is inlaid along the top surface of each of metallic strips 70, and together with a strip of magnetic material 78, placed over each edge of a lead frame strip, maintains the lead frame strip in its referenced position.

Lower section 12 comprises, inter alia, a block 100, shown as having various sections for ease of maintenance, and a plurality of apertures 102 extending partially therethrough at the intersection of the rows and columns of an array which correspond to the location of apertures 32 in the array in bonding insert assembly 16. A separate piston 104 is slidably mounted in each of apertures 102, each piston 104 preferably having an enlarged base 106 to obtain a pressure amplification between the bottom surface of base 106 and the top surface of piston 104. Base 106 of each piston 104 is adapted to engage the upper surface of a common diaphragm 108. A chamber 110 is formed in block 100 beneath diaphragm 108 covering the area encompassing bases 106 of pistons 104, chamber 110 being connected by a passage 112 to a port 114. Port 114 is adapted for connection to a regulatable source of pressurized fluid (not shown), whereby to increase the pressure beneath diaphragm 108 and raise pistons 104 or selectively to decrease the pressure beneath diaphragm 108 and lower pistons 104. Chamber 110 can comprise any well-known form, such as, for example, a serpentine-shaped channel or a cavity with or without supporting members for diaphragm 108. A biasing means 116 is preferably provided to ensure that the base 106 of each piston 104 is in continuous contact with diaphragm 108, and to assist in returning pistons 104 to their initial or starting position. Biasing means 116 can comprise any well-known form, and is shown in FIGS. 2 and 3 as comprising a separate spring encircling each of pistons 104.

Means are provided on block 100 of lower section 12 for both mounting bonding insert assembly 16 on block 100 and referencing the array of rams 34 of bonding insert assembly 16 to the corresponding array of pistons 104 in lower section 12. The mounting and referencing means can comprise any well-known form, and are shown in FIGS. 1 and 3 as comprising two spaced-apart projections 120 running parallel to each other along the top surface on the opposed sides of block 100, and a backstop 122 running along the top rear surface of block 100. A slot 124 is formed in the inwardly facing surface of each of projections 120, the slots having both a separation which corresponds to the width of bonding insert assembly 16 and a position which references the columns of the array of rams 34 of bonding insert assembly 16 with the corresponding columns of the array of pistons 104 of lower section 12. Backstop 122 is positioned on block 100 to reference the rows of the array of rams 34 of bonding insert assembly with the corresponding rows of the array of pistons 104 of lower section 12 when the bonding insert assembly 16 is mounted in slots 124 and against backstop 122.

Upper section 14 comprises a thermode 150 which extends over bonding insert assembly 16; heater elements 152 which can comprise any well-known form such as, for example, cartridge heaters; and an array of extensions 154 projecting from thermode 150, the extensions being referenced to the array of rams 34 and pistons 104 of bonding insert assembly 16 and lower section 12, respectively. A predetermined thickness of a rather rigid insulating material 156 is preferably positioned between thermode 150 and the remaining portion of upper section 14 to substantially reduce the heat loss from thermode 150 into upper section 14. A plurality of L-shaped brackets 158 fixedly hold thermode 150 against insulating material 156 after extensions 154 on thermode 150 have been referenced to the array of rams 34 and pistons 104 of bonding insert assembly 16 and lower section 12, respectively.

Means should preferably be provided to reduce the possibility that the heat from thermode 150 might affect the operation of pistons 104 in apertures 102 of lower section 12. These means can comprise any well-known form, and are shown in FIGS. 2 and 3 as comprising a thermal radiation reflection shield 130 mounted in a recess 132 formed in the top surface of block 100 encompassing the area of apertures 102, reflection shield 130 having apertures 134 which correspond with the location of apertures 102 in block 100. Reflection shield 130 can be mounted in direct contact with recess 132 in block 100, as shown in FIG. 2, or on cooling coils or standoffs 136 to provide an airspace between shield 130 and recess 132 as shown in FIG. 3. Thermal-radiation reflection shields 138 can similarly be mounted to the sidewalls of L-shaped bracket 18 and lower section 12 as shown in FIGS. 1 and 3 to substantially reduce the heat load on the frame members of lower and upper sections 12 and 14 for safety reasons.

The apparatus as described operates to simultaneously thermocompression bond a plurality of lead frames 22 to the metallized areas of a plurality of substrates 24 in the following manner. With bonding insert assembly 16 removed from mass bonder 10, a plurality of lead frames 22, preferably in strip form, are referenced and mounted adjacent the corresponding bonding tips 36 in each row of the array of bonding tips. The metallized bonding sites on the plurality of substrates 24 are then referenced and placed in contact with the corresponding leads of the associated lead frame 22. A source of vacuum (not shown) is selectively applied to port 54, and in turn to ducts 52, chambers 50, and apertures 62 in both rams 34 and bonding tips 36 to hold the substrates 24 in their referenced position.

Bonding insert assembly 16 is then inserted into slots 124 of spaced-apart projections 120 on lower section 12 and into contact with backstop 122. In this position, substrates 24, lead frames 22, bonding tips 36 and rams 34 of bonding insert assembly 16 are referenced to their respective pistons 104 in lower section 12 and projections 154 on thermode 150 of upper section 14.

Figure 4:
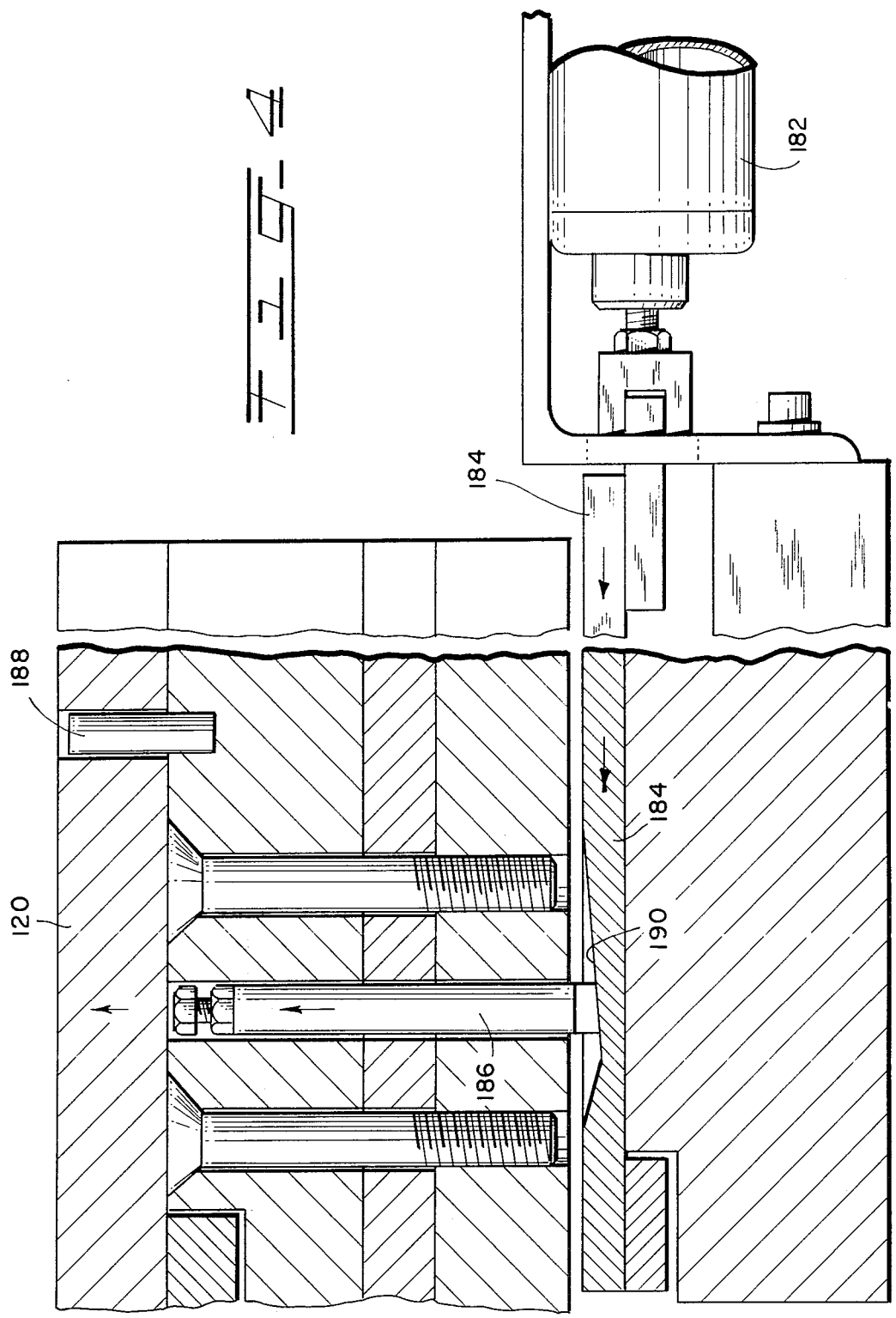
FIG. 4 is a side elevation view of the lower section of the apparatus of FIG. 1 with portions broken away in order to show certain details.

To reduce the possibility of substrates 24 being moved from their referenced positions by contacting projections 154 on thermode 150 during the insertion of bonding insert assembly 16 in slots 124, means are preferably provided which permit bonding insert assembly 16 to be inserted well below projections 154 and then moved into close proximity thereof once bonding insert assembly 16 is in contact with backstop 122. Such means can comprise any well-known form, and is shown in FIGS. 1 and 4 as comprising a switch 180, means 182 for longitudinally moving two spaced-apart and interconnected cam bars 184 which are located below the respective spaced-apart projections 120 on lower section 12, rods 186 which follow cam surfaces 190 on cam bars 184 for raising and lowering projections 120 on lower section 12, and pins 188 for limiting sideways motion of projections 120 as projections 120 are raised or lowered. At least two rods 186 and associated cam surfaces 190 are provided for each projection 120 to ensure parallel movement of projections 120 as they are raised or lowered. More particularly, switch 180 is normally in the deactivated state with bonding insert assembly 16 removed from mass bonder 10. The contacting of bonding insert assembly 16 with backstop 122 causes switch 180 to attain the activated state and energize means 182 to move cam bars 184 in the direction indicated in FIG. 4. The indicated movement of cam bars 184 causes rods 186 to move in the direction indicated in FIG. 4 as a result of following cam surfaces 190 on cam bars 184. The upward movement of rods 186 causes projections 120 to be raised and the referenced substrates 24 on bonding insert assembly 16 to be elevated adjacent the respective projections 154 on thermode 150. Means 182 can comprise any conventional form, such as, for example, an air-operated piston or electrical solenoid.

With bonding insert assembly in the elevated position, a fluid at a predetermined pressure is selectively applied to port 114 of lower section 12. The pressurized fluid is in turn applied to chamber 110 through passage 112 to raise diaphragm 108 and thereby concurrently and independently raising each of the plurality of pistons 104. The application of pressurized fluid to port 114 can, of course, be accomplished in many known ways. For instance, a second switch 192 can be located in upper section 14, as shown in FIG. 1, second switch 192 being activated when bonding insert assembly 16 attains its highest position to open a valve (not shown) controlling the pressurized fluid to port 114.

The concurrent and independent longitudinal upward movement of pistons 104 in lower section 12 concurrently and independently raises the rams 34 and bonding tips 36 in bonding insert assembly 16, the lead frames 22, and the substrates 24 such that the surface of substrates 24 opposite the metallized bonding sites thereon engage the associated heated projections 154 on thermode 150 to provide the necessary bonding temperature through each substrate 24 to each bonding site, while a concurrent equal bonding force is applied to the lead frames 22 and the associated bonding sites on substrates 24. Once bonding is completed, the pressure to port 114 is reduced to deflate diaphragm 108 and lower rams 34 and pistons 104, and means 182 is de-energized to move cam bars 184 in a direction opposite that shown in FIG. 4, thereby to restore mass bonder 10 to its initial state before bonding insert assembly 16 is removed and unloaded. A lead frame 22 which has been bonded to the metallized bonding sites on a substrate 24 by the present apparatus is shown in the plan view of FIG. 5.

The present mass bonder 10 provides many advantages over the prior art single lead frame bonders. A most obvious advantage is increased productivity which can provide ancillary advantages. For instance, where a bonding temperature of 300°C would be required at each bonding site, prior art single lead frame bonders are generally operated at a high temperature as, for example 500°–700°C in order to rapidly heat each bonding site for maximum production capabilities. With the ability to simultaneously bond, for instance, 120 lead frames to 120 substrates in a 10 × 12 array, the present mass bonder 10 can use a bonding cycle which is much longer, e.g., 25 seconds, than is used with single lead frame bonders while still improving overall production capabilities. The extended bonding cycle permits the use of lower thermode temperatures, such as, for example, 350°C, which in turn substantially avoids oxidation of the thermode, as found when higher thermode temperatures are used, or the need to use thermode material which can accommodate the much higher temperatures.

The present arrangement, prior to bonding, maintains the associated plurality of bonding tips 36, lead frames 22, and substrates 24 in their referenced state without heat being applied thereto, thereby avoiding problems such as, for example, expansion of the lead frame strip. Additionally, air is continually being passed between bonding tips 36 and the associated substrates 24 in the area between the leads of lead frames 22 as a result of vacuum being applied to chambers 50 and apertures 62 in bonding tips 36, thereby to provide a cooling effect both prior to and during bonding while maintaining the substrates 24 in their referenced position. Magnetic strip 78 and metallic strip 70 also tend to keep the edges of lead frames 22 cooled to prevent buckling of the lead frames during bonding.

During bonding, the raising of pistons 104 in lower section 12, rams 34 in bonding insert assembly 16, and bonding tips 36 by the application of a pressurized fluid to chamber 110 beneath diaphragm 108 causes lead frames 22 and substrates 24 to be clamped together, in their referenced state, between bonding tips 36 and projections 154 on thermode 150 just prior to the development of any significant temperature rise in the lead frame. Since lead frames 22 and substrates 24 are in their aligned positions prior to substrates 24 contacting projections 154, and since an insignificant amount of time actually passes before a bonding pressure is applied to the bonding sites on substrate 24, registration of lead frame 22 with the associated metallized bonding sites on substrates 24 is virtually assured, thereby avoiding problems of lead frame expansion, etc.

The present ability to use a thermode temperature slightly above that needed to effect the bond, permits the application of heat to the bonding sites through the substrates themselves, rather than by the preferred prior art method of applying heat through the leads being bonded. The use of lower thermode temperatures permits the substrate to be heated throughout at a more uniform temperature, thereby to avoid stresses in the substrate and to achieve an ultimate temperature which avoids overheating of the substrate and the circuit thereon.

It is to be understood that the above-described embodiments are simply illustrative of the principles of the invention. Various other modification and changes may be made by those skilled in the art which will embody the principles of the invention and fall within the spirit and scope thereof.

What is claimed is:

1. A method for concurrently bonding the leads of a plurality of lead frames to respective bonding sites on the first faces of a corresponding plurality of substantially planar articles, each of said articles having a second face opposite said first face, said method comprising:
   a. registering the leads of each of said plurality of lead frames with a separate associated bonding tip;
   b. registering the bonding sites on each of said plurality of articles with the respective leads on the associated one of said plurality of lead frames and between the lead frame and a heated thermode;
   c. concurrently and independently moving each of said referenced bonding tips, lead frames, and articles in a first direction for engaging the second face of each of said plurality of articles with the heated thermode; and
   d. thereafter applying a substantially uniform bonding pressure with said bonding tips concurrently to all of said leads and associated bonding sites, thereby to concurrently bond said plurality of lead frames to the respective bonding sites on said plurality of planar articles.

2. Method as in claim 1, wherein:
   e in performing step (c), said bonding tips, lead frames, and articles are moved in a plane perpendicular to the plane of said thermode.

3. Method as in claim 1, wherein each of said bonding tips is mounted on a separate piston, all of said pistons being mounted for independent axial movement in a plane perpendicular to the plane of said bonding sites on the associated article, said method further comprising:
   e. in performing step (c), said pistons are independently moved in a longitudinal direction by a means commonly associated with all of said pistons.

4. Method as in claim 1, wherein:
   e. prior to performing step (c), simultaneously moving all of the bonding tips, with the referenced lead frames and planar articles thereon, in a first direction and into close proximity to said thermode.

5. Apparatus for concurrently bonding the leads of a plurality of lead frames to respective bonding sites on the first faces of a corresponding plurality of substantially planar articles, each of said articles having a second face opposite said first face, said apparatus comprising:
   a. a plurality of independently movable bonding tips, one for each lead frame, positioned in a predetermined array of bonding tips and adapted to engage the leads of the associated lead frames;
   b. a thermode adapted to simultaneously engage the second faces of all of said plurality of articles and to be heated to bonding temperature; and
   c. operating means adapted to concurrently and independently move each of the associated bonding tips, lead frames, and planar articles in a first direction to engage the second face of each of the plurality of planar articles with the thermode and apply a substantially uniform bonding pressure through said bonding tips concurrently to all of said lead frames and bonding sites.

6. Apparatus as in claim 5, further comprising:
   d. registration means to register each of the lead frames with the associated bonding tip and bonding sites on the respective planar article.

7. Apparatus as in claim 6, further comprising:
   e. means for maintaining the registration of each of said lead frames with the respective bonding tip and bonding sites on the associated planar article.

8. Apparatus as in claim 6, further comprising:
   e. means for simultaneously moving said array of bonding tips, and the referenced lead frames and planar articles thereon, in said first direction and into close proximity to said thermode.

9. Apparatus as in claim 5, further comprising:
   d. a plurality of pistons, each piston adapted to mount a separate one of said plurality of bonding tips in one end thereof and to contact said operating means at the other end thereof.

10. Apparatus as in claim 9, wherein said operating means comprises a fluid-pressure expandable means in continuous contact with the other end of all of said plurality of pistons.

11. Apparatus as in claim 9, wherein each of said plurality of pistons has an enlarged base for providing pressure amplification between said other end and one end thereof during bonding.

12. Apparatus for simultaneously bonding a plurality of lead frames to respective bonding sites on a first face of each of a plurality of substantially planar articles, said articles having a second face opposite said first face, said apparatus comprising:
   a. a plurality of independently movable bonding tips, one for each lead frame, positioned in a predetermined array of bonding tips and adapted to engage the leads of the associated lead frames;
   b. a plurality of independently movable pistons, adapted to mount a separate one of said plurality of bonding tips in one end thereof;
   c. registration means for registering each of the lead frames with the associated bonding tip and the bonding sites on the respective planar article;
   d. a thermode adapted to simultaneously engage the second face of said plurality of articles and to be heated to bonding temperature; and
   e. operating means adapted to concurrently and independently move all of said plurality of pistons, and in turn, said plurality of registered bonding tips, lead frames and planar articles, in a first direction to engage the second face of each of the plurality of planar articles with said thermode and apply a substantially uniform bonding pressure through said pistons and bonding tips concurrently to all of said plurality of lead frames and bonding sites.

13. Apparatus as in claim 12, said operating means comprising a fluid pressure expandable means in contact with the other end of all of said plurality of pistons.

14. Apparatus as in claim 12, wherein each of said plurality of pistons has an enlarged base for providing pressure amplification between the other end and the one end thereof during bonding.

* * * * *